(12) United States Patent
Banish et al.

(10) Patent No.: US 7,145,721 B2
(45) Date of Patent: Dec. 5, 2006

(54) ANTI-REFLECTIVE STRUCTURES

(75) Inventors: Michele Banish, Huntsville, AL (US); Rodney L. Clark, Gurley, AL (US)

(73) Assignee: Mems Optical, Inc., Huntsville, AL (US)

( * ) Notice: Subject to any disclaimer, the term of this patent is extended or adjusted under 35 U.S.C. 154(b) by 0 days.

(21) Appl. No.: 09/985,403

(22) Filed: Nov. 2, 2001

(65) Prior Publication Data

US 2002/0135869 A1    Sep. 26, 2002

Related U.S. Application Data

(60) Provisional application No. 60/245,208, filed on Nov. 3, 2000.

(51) Int. Cl.
*G02B 5/18* (2006.01)

(52) U.S. Cl. .............................. 359/569; 216/24; 430/5

(58) Field of Classification Search ................ 359/566, 359/565, 569, 900; 430/5, 6, 11; 216/11, 216/12, 24–26
See application file for complete search history.

(56) References Cited

U.S. PATENT DOCUMENTS

| | | | | |
|---|---|---|---|---|
| 4,013,465 A * | 3/1977 | Clapham et al. ............. 430/11 |
| 4,456,501 A * | 6/1984 | Bayman et al. ............. 438/704 |
| 4,729,815 A * | 3/1988 | Leung ......................... 438/714 |
| 5,007,708 A | 4/1991 | Gaylord et al. |
| 5,120,605 A | 6/1992 | Zuel et al. |
| 5,373,182 A | 12/1994 | Norton |
| 5,482,800 A | 1/1996 | Gal ............................... 430/5 |
| 5,483,387 A | 1/1996 | Bauhahn et al. ............. 359/885 |
| 5,561,558 A * | 10/1996 | Shiono et al. ............. 359/569 |
| 5,694,247 A * | 12/1997 | Ophey et al. ............... 359/566 |
| 5,701,008 A | 12/1997 | Ray et al. .................... 250/352 |
| 5,808,350 A | 9/1998 | Jack et al. .................. 257/440 |
| 5,822,091 A * | 10/1998 | Baker .......................... 359/10 |
| 6,107,000 A * | 8/2000 | Lee et al. .................... 430/296 |
| 6,144,083 A * | 11/2000 | Yin .............................. 257/437 |
| 6,359,735 B1* | 3/2002 | Gombert et al. ............ 359/580 |
| 6,410,213 B1* | 6/2002 | Raguin et al. .............. 430/321 |
| 6,914,724 B1* | 7/2005 | Redmond .................... 359/619 |

FOREIGN PATENT DOCUMENTS

| | | |
|---|---|---|
| DE | 3831503 A1 | 3/1990 |
| EP | 0797255 A2 | 9/1997 |

(Continued)

OTHER PUBLICATIONS

Motamedi, M.E. et al., "Antireflection surfaces in silicon using binary optics technology", Applied Optics, vol. 31, No. 22 (Aug. 1, 1992), pp. 4371-4376.*

(Continued)

*Primary Examiner*—Alessandro Amari
(74) *Attorney, Agent, or Firm*—McGrath, Geissler, Olds & Richardson, PLLC

(57) ABSTRACT

An anti-reflective structure is formed on a surface to transmit incident light with minimal losses. The anti-reflective surface has a plurality of protrusions having a feature size smaller than the wavelength of incident light. The protrusions increase in height in either a sloped linear manner or in a curvilinear manner, and the protrusions repeat across the surface in at least one dimension to transmit the incident light. Gray scale lithography may be used to produce these patterns of protrusions in photoresist layers. High fidelity transfer of the protrusion patterns into the surfaces is accomplished by utilizing, for example, an electron cyclotron resonance plasma. Transmission values at such patterned surfaces maybe as high as 99.3%.

21 Claims, 19 Drawing Sheets

FOREIGN PATENT DOCUMENTS

WO     WO 98/39673 A     9/1988

OTHER PUBLICATIONS

Gaylord, et al., "Zero-reflectivity high spatial-frequency rectangular-groove dielectric surface-relief gratings", Applied Optics, OSA, Optical Society of America, Washington, DC, vol. 25, No. 24, Dec. 15, 1986 pp. 4562-4567.

Pearton, et al., "Plasma Etching of ZnS, ZnSe, CdS, and CdTe in Electron Cyclotron Resonance $Ch_4/H_2/Ar$ and $H_2/Ar$ Discharges", Journal of Vacuum Science and Technology: Part B, AVS/AIP Melville, New York, NY, vol. 11, No. 1, Jan. 1993, pp. 15-19.

* cited by examiner

*Conventional Art*

*Prior Art*

ANTI-REFLECTIVE STRUCTURES

This application claims priority on provisional Application No. 60/245,208 filed on Nov. 3, 2000, the entire contents of which are hereby incorporated by reference.

FIELD OF THE INVENTION

The present invention is directed to optical structures and, more particularly, to subwavelength optical structures that may be advantageously used to couple light into a surface.

BACKGROUND OF THE INVENTION

A subwavelength structure is an optical structure having features smaller than a wavelength of an illuminating beam. Subwavelength structures may have periodically repeating features, either over the entire structure or with different periods over different portions of the structure. Subwavelength structures also may have more than one period spatially superimposed. The period of a uniformly periodic diffraction grating may be defined as the smallest distance over which the grating structure repeats. If the grating period of the subwavelength structure is less than half of the incident beam's wavelength, then only the zeroth diffraction order propagates, and all other diffraction orders are evanescent. Subwavelength structures show interesting properties such as antireflection, form birefringence, and emulation of distributed index materials.

Subwavelength structures have been used in the prior art, for example as antireflection surfaces. An example of this prior art technology is U.S. Pat. No. 5,007,708 to Gaylord et al., which describes a technique for producing antireflection grating surfaces on dielectrics, semiconductors and metals. However, these structures have been limited to rectangular geometries or stacks of rectangles. The resulting contour is, at best, a piecewise approximation of a smooth, analog, profile. In contrast, lithographic technology can fabricate smooth, analog profiles to achieve maximum transmission. The smooth, analog profiles attain maximum transmission over a wide range of structure depths. This feature makes these smooth analog profiles better suited to operate over large areas and high production volumes.

Lenses, microlenses, windows, sensing planes, and other products that are illuminated with light are often anti-reflection coated with a multi-layer dielectric stack. The purpose of the coating is to maximize the transmission at a single, multiple or a broad range of wavelengths. It is these products that would benefit from a surface structure as a replacement to the traditional coating.

The disadvantages of traditional coatings are: 1) the thermal expansion of the coating differs from the substrate, and during use, coatings can become separated from the substrate; 2) coatings have a shorter lifetime than that of the substrate material; and 3) coatings on plastic products are extremely expensive when compared to the price of plastic products. What is needed is an anti-reflective structure that is integrated into the substrate itself thereby having identical thermal expansion properties, equal lifetime and if integrated into a mold can be fabricated in the plastic product in a single step.

Extensive use is made of infrared (IR) imaging systems on helicopters, combat vehicles, missiles, and in man-portable equipment. Systems whose sensitivity and resolution exceed those of the currently fielded second generation devices are required for a new generation of devices which are "smart" enough to transfer part of the burden of target acquisition and identification from the soldier to the device itself to satisfy the requirements of Future Combat Systems. The infrared Focal Plane Array (FPA), which serves as the artificial retina for these systems, contains as many as about $10^6$ pixels where optical detection and charge readout occur. In high performance FPAs, the ternary semiconductor alloy HgCdTe is used for optical detection and Si is used for the readout integrated circuit (ROIC). Arrays now in production are "hybrid" packages where detector and ROIC arrays are fabricated on separate manufacturing lines and subsequently indium-bump bonded to each other pixel by pixel to provide paths for charge flow and image transfer. In future arrays, the functions of detection and read-out are expected to be monolithically integrated on a single silicon chip, thereby eliminating the need for the indium-bump process.

A schematic cross sectional drawing of a portion of a HgCdTe detector array of the conventional art is given in FIG. 1a. Individual mesas 1 etched into the "front" surface of the HgCdTe epilayer 2 are the location of the individual photovoltaic pixels. Radiation 3 from a scene arrives at the back surface 9 of the CdznTe substrate wafer 4. A portion of the radiation crosses the back surface 9 and then the interface between the substrate 4 and epilayer 2. The shaded region underneath each mesa is the "active" area 5 where photons are absorbed and converted to electrons, which give rise to a current, which is proportional to the intensity of the absorbed radiation.

The efficiency of the conventional art device shown in FIG. 1a is depicted in FIG. 1b. The efficiency of the conventional art device depends on the amount of radiation 8 which reaches the active area 5. When radiation of wavelength $\lambda$ encounters an interface 6 between two media (such as a vacuum and the back surface 9 of a FPA). A fraction $R(\lambda)$, also called R, of the radiation 7 is reflected from the interface 6 and (1−R) 8 crosses the interface 6. To achieve maximum photo detection efficiency, it is of interest to minimize the value of R. However, a smooth vacuum to CdznTe interface has an abrupt change in refractive index from unity to 2.67, which limits the transmission value to 80% in the 8–12 μm spectral region. This problem is addressed on second generation FPAs by depositing a dielectric coating onto a surface of the FPA substrate 4.

Also, even in the dark, the active region in a photodetector is a source of noise currents whose magnitude is proportional to the volume of the active area 5. To minimize this effect, and thereby increasing the signal to noise ratio of a mesa diode, the volume of the active layer 5 should be minimized. A tradeoff clearly exists between the requirements of maximizing the signal by intercepting a large fraction of the incoming radiation and minimizing the source of noise by minimizing the volume of the active layer.

Antireflective coatings have fundamental and practical limitations. In principle, they can be designed to minimize R only at a single wavelength. When R is to be minimized over broad spectral bands such as the 3–5 μm and the 8–12 μm atmospheric windows utilized for target detection, a compromise must be made. Secondly, mismatches between thermal coefficients of expansion of coating layer and CdZnTe or Si substrate wafers often lead to peeling of the coating when FPAs are cooled from room temperature to a 77° K. operating temperature. An alternative to a dielectric coating, proposed more than a decade ago, is a periodic corrugated structure etched into the surface of an optical element such as a wafer. The effective change in the refractive index at the interface can be made vanishingly small by a proper choice of shape, period, and depth and the effective value of R thereby minimized. If the period is less than the wavelength of the incident radiation by at least a factor of two, then the structure is antireflective over a broad range of incident angles and wavelengths. For IR radiation, antireflective structures (ARS) would have periods on the order of several microns. However, such corrugated structures exhibit limitations due to the rectangular (binary) shape.

As has been shown, an array of photovoltaic diodes fabricated in HgCdTe epitaxial layers on CdZnTe substrates is the baseline detector architecture for high performance infrared focal plane arrays (IRFPAs). In contrast, current generation arrays have a disadvantageous thin dielectric antireflective layer deposited onto the substrate surface to enhance coupling of the incident radiation into the wafer. However, a smooth vacuum to CdZnTe interface has an abrupt change in refractive index from unity to 2.67 which limits the transmission value to 80% in the 8–12 µm spectral region. Modern FPA technology now requires transmission values above 80%. To achieve this, an interface with roughness on a scale smaller than the wavelength of the incident radiation would have an effective change in refractive index which is gradual, thereby consequently achieving an optical transmission value considerably higher than 80%.

SUMMARY OF THE INVENTION

The invention, in part, pertains to an anti-reflective surface structure with a profile that overcomes one or more problems or limitations of the conventional anti-reflective coating and rectangular (binary) anti-reflective structures.

The invention, in part, pertains to a structure is fabricated in the surface of a substrate such that the surface takes the shape of a subwavelength structure with analog contours. The analog contours may be smoothly varying linear or curvilinear shapes that need not be fabricated as multilevel stacks of one or more rectangles.

The invention, in part, pertains to an anti-reflective structure formed on a surface to transmit incident light that has a plurality of protrusions having a feature size that is smaller than a wavelength of the incident light. The protrusions smoothly increase in height in either a sloped linear manner or in a curvilinear manner, and the protrusions repeat across the surface in at least one dimension to transmit the incident light. The protrusions may or may not repeat across the surface in two dimensions. The surface may be curved or planar. The protrusions may have a sinusoidal cross-section or a triangular cross section. The surface may be formed from at least one material selected from the group consisting of CdTe, CdZnTe, $Cd_{0.97}Zn_{0.03}Te$, Si, ZnSe and CdTe/Si. The protrusions may periodically repeat across the surface in two dimensions.

The method, in part, pertains to a detector array which contains an epilayer containing at least one pixel; a substrate over the epilayer, the substrate having a surface opposite the epilayer; at least one microlens at the surface of the substrate, the microlens having a focal length that reaches to an active region of the pixel; and a microlens surface on the microlens, the microlens surface having an anti-reflective structure to transmit incident light. The anti-reflective structure contains a plurality of protrusions having a feature size that is smaller than a wavelength of the incident light and smoothly increasing in height in either a sloped linear manner or in a curvilinear manner, the protrusions repeating across the microlens surface to transmit the incident light. The epilayer may be HgCdTe. The substrate may be CdZnTe. The protrusions may periodically repeat across the surface in two dimensions.

The invention, in part, pertains to a method to manufacture an anti-reflective structure that forms a layer of photoresist over a substrate, draws a cone pattern in the photoresist, and etches the photoresist. The anti-reflective structure has a plurality of protrusions with a feature size that is smaller than a wavelength of incident light, and the protrusions are smoothly increasing in height in either a sloped linear manner or in a curvilinear manner.

The invention, in part, pertains to a technique which is compatible with IRFPA manufacturing technology has been developed to fabricate anti-reflective structures into CdZnTe. Elements of the technique may include the use of gray scale photolithography and electron cyclotron resonance (ECR) plasma etching.

When an incident light beam illuminates the structured surface of the invention, the surface structure includes periodic or non-periodic features that are smaller than a wavelength of the incident light beam, wherein the structure selectively transmits the light beam and the reflected component is minimized or is zero.

Additional applications for ARS include their use on lenses and windows, on integrated photonic devices, color filters and separators, beam couplers for short-wavelength lasers, on flat panel displays and numerous other optical applications.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate several embodiments of the invention and, together with the description, serve to explain the principles of the invention.

FIG. 4a is a profile scan of a smooth subwavelength structure.

FIG. 4b is a three-dimensional scan of a smooth subwavelength structure.

DESCRIPTION OF THE PREFERRED EMBODIMENTS

Figure 1A:
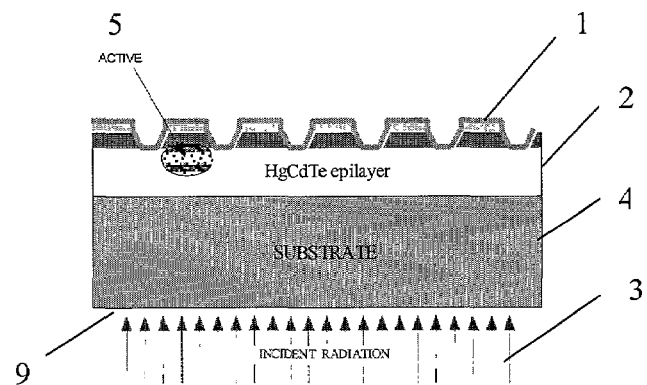
FIG. 1a is a schematic drawing of a conventional HgCdTe detector array with mesa architecture.

Advantages of the present invention will become more apparent from the detailed description given herein after. However, it should be understood that the detailed description and specific examples, while indicating preferred embodiments of the invention, are given by way of illustration only, since various changes and modifications within the spirit and scope of the invention will become apparent to those skilled in the art from this detailed description.

A preferred FPA interface has an array of micro lenses whose surfaces were corrugated with ARS (anti-reflective surfaces). Recent advances in lithography and plasma etching have made the fabrication of such a structure feasible. An object of the invention demonstrates enhanced detection in a HgCdTe IRFPA (infrared focal plane array) by adding micro lenses and ARS to a CdZnTe or Si substrate wafer surface. A preferred embodiment demonstrates the feasibility of fabricating both structures using a single inexpensive manufacturing step. In the preferred embodiment, micro lenses have been fabricated in CdZnTe and in silica, ARS have been fabricated in CdZnTe and in silicon, and feasibility of combining fabricating ARS on a micro lens surface was demonstrated in silicon.

Compared to conventional coatings, embedded ARS of a preferred embodiment have the advantages of ease of attaining high transmission in a broad spectral region and for a broad range of incident angles, low cost of fabrication, and robustness under thermal cycling. A technique which is compatible with IRFPA manufacturing technology has been developed to fabricate anti-reflective structures into CdZnTe. Elements of the technique are the use of gray scale photolithography and electron cyclotron resonance (ECR) plasma etching.

The conventional art indicates that anti-reflective performance is to be achieved with coatings or surface structures that are binary or fabricated as stacks of rectangles. The stacked rectangles form a piecewise approximation of a curve. In an embodiment of the invention, the curve is fabricated in the substrate material using either lithographic technology or constructive and destructive interference. The invention imposes smoothly structured surfaces on flats and on curved substrates. The advantages of the smoothly shaped surfaces include improved transmission at a large range of structure depths and over a wide range of illuminating wavelengths.

The conventional art rectangular (binary) structures must be fabricated to a very small range of depths in order to achieve the required optical performance. The smooth analog structures can be etched to a wide variety of depths to achieve the required optical performance. This is one advantage of this invention. The variability in structure depth becomes important when anti-reflection properties are desired over large surfaces or in large production quantities.

In an embodiment of the invention, it is possible to design and fabricate surface structures that improve detector performance within a desired waveband. The anti-reflective performance of a sinusoidal and triangular structures show a desirable low reflectivity as the etch depth increases. The flat performance curve with increased etch depth reveals manufacturing process latitude. The ability to vary the etch depth while maintaining the required reflectance is an advantage over the prior art binary structures.

Also, in accordance with an embodiment of the present invention, there is provided a method of coupling an incident light beam into a substantially planar surface or on a substantially non-planar surface. A convex or concave lens or a convex or concave mirror are an examples of the non planar surfaces.

Based upon analysis using Rigorous Coupled Wave (RCW) theory, it has been determined that the reflectance of a subwavelength structure is a function of the spatial period, the feature size, refractive index of the material, and the depth of the structure. These features can be packed as squares and hexagonal (close) packing can further improve the anti-reflection performance. Lithography techniques (e.g., gray-scale masking techniques and holographic techniques) allow the patterning of smooth profiles.

Figure 2:
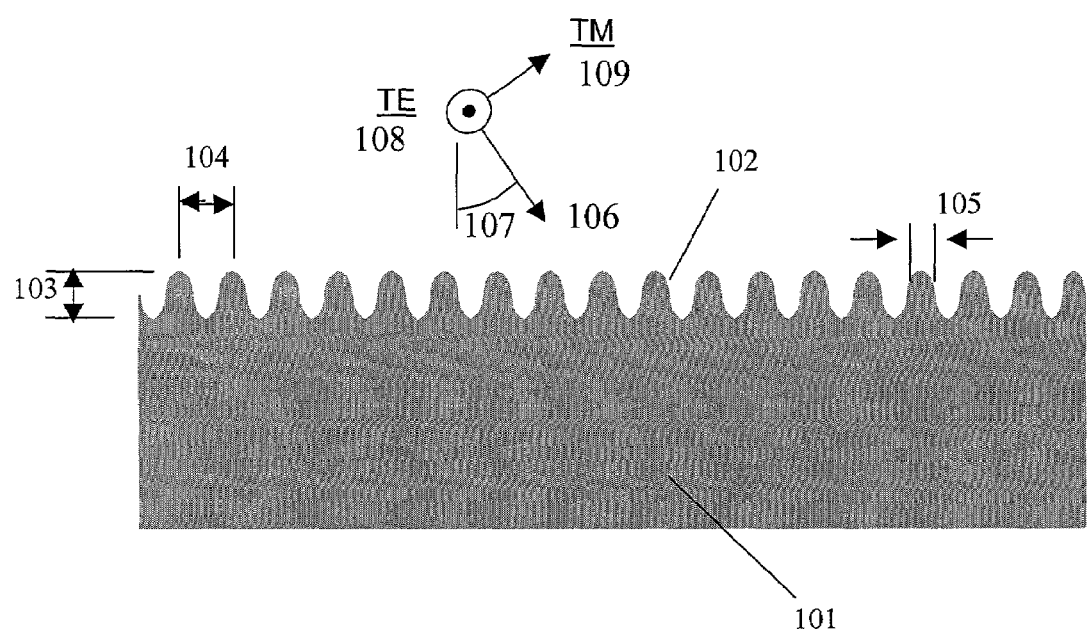
FIG. 2 is a schematic view of a subwavelength surface structure that is a smooth contour.

FIG. 2 is a schematic view of a subwavelength surface structure that has a smooth contour. The structure has a bulk component 101 and a ridged or roughened surface component 102. The surface component 102 has a sinusoidal (or alternatively triangular) cross section having an amplitude 103 and a distance between peaks 104, which is the pitch. The mean peak width 105 is the feature size. The illuminating wave 106 can be at normal or any angle of incidence 107. Due to the geometric anisotropy of the grating structure, the two orthogonally polarized optical fields, one parallel to the grating grooves (designated TE field) 108 and the other perpendicular to the grating grooves (designated as TM field) 109 encounter different effective dielectric constants and thus acquire a phase difference between them. The structure's contour can be optimized to maximize the transmission at a specific angle of incidence 107 or to operate at a broad range of angles.

Figure 3:
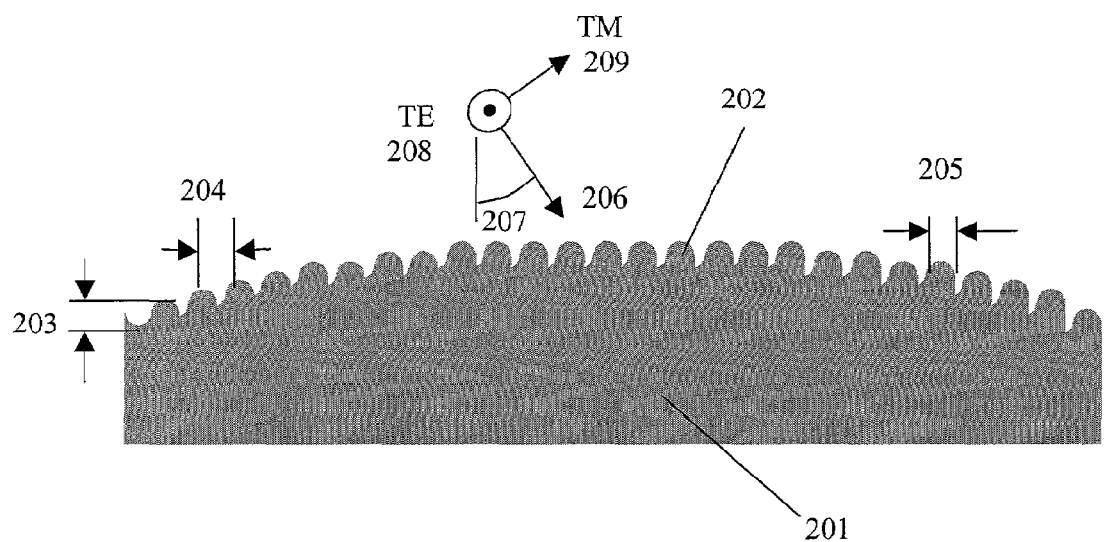
FIG. 3 is a subwavelength surface structure that is fabricated on a non-flat substrate.

In comparison, FIG. 3 shows a subwavelength surface structure that is fabricated on a non-flat substrate. The structure has a bulk component 201 and a ridged or roughened surface component 202. The surface component 202 has a sinusoidal (or alternatively triangular) cross section having an amplitude 203 and a distance between peaks 204, which is the pitch. The mean peak width 205 is the feature size. The illuminating wave 206 can be at normal or any angular incidence 207. Due to the geometric anisotropy of the grating structure, the two orthogonally polarized optical fields, one parallel to the grating grooves (designated TE field) 208 and the other perpendicular to the grating grooves (designated as TM field) 209 encounter different effective dielectric constants and thus acquire a phase difference between them. The structure's contour can be optimized to maximize the transmission at a specific angle of incidence 207 or to operate at a broad range of angles.

Figure 1B:
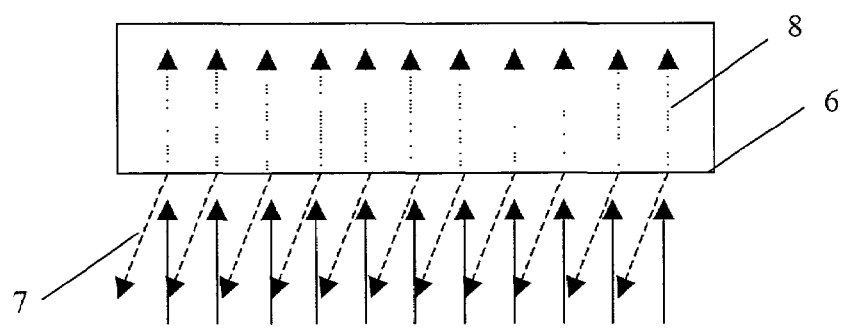
FIG. 1b shows light reflectance from a conventional array interface.

The subwavelength surface structure shown in FIG. 3 may represent a preferred embodiment of the invention where surface component 202 is the surface of a light concentrating microlens. If the radiation which crosses the vacuum/substrate interface 6, depicted in FIG. 1b, could be focused, then the volume of the active region 5 could be made smaller without loss of absorption efficiency. In a preferred embodiment of the invention, this is accomplished by placing a "micro lens" at the interface whose focal point is in the active region. For a FPA, an array of micro lenses would be arranged in one to one correspondence with the individual pixels. This configuration is shown in FIG. 17.

Figure 17:
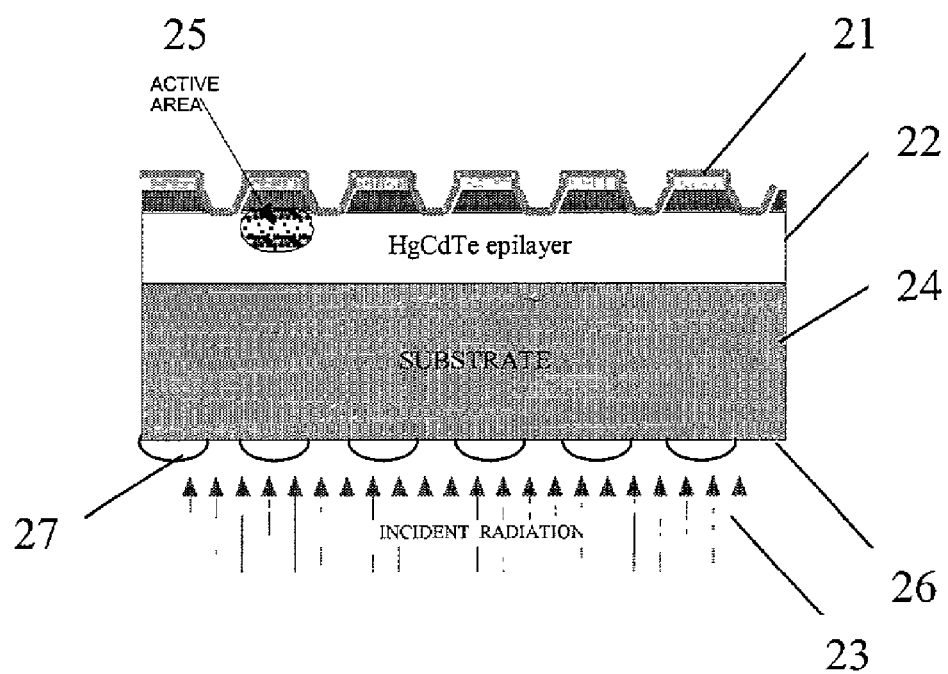
FIG. 17 shows a cross sectional drawing of a portion of a HgCdTe detector array that incorporates microlenses according to a preferred embodiment of the invention.

A schematic cross sectional drawing of a HgCdTe detector array that incorporates microlenses according to a preferred embodiment of the invention is shown in FIG. 17. Individual mesas 21 etched into the "front" surface of the HgCdTe epilayer 22 are the location of the individual photovoltaic pixels. Radiation 23 from a scene arrives at the back surface 26 of the CdZnTe substrate wafer 24. Microlenses 27 are formed at the back surface 26 such that the microlenses 27 have a focal length corresponding to their respective active areas 25. A portion of the radiation 23 crosses the back surface 26 through the microlenses 27, and then the radiation passes through interface between the substrate 24 and epilayer 22. The shaded region underneath each mesa is the "active" area 25 at the focal length of the microlenses 27 where photons are absorbed and converted to electrons, which give rise to a current, which is proportional to the intensity of the absorbed radiation.

As shown in FIG. 17, the microlenses 27 are placed such that the focal length lies in the active areas 25 of a FPA. In this preferred embodiment, not only is the transmission loss minimized, but also the radiation concentrating effect of the microlens allows the minimization of the volume of the active area 25. As a result, dark current effects from large volume active areas are minimized as well.

Figure 4C:
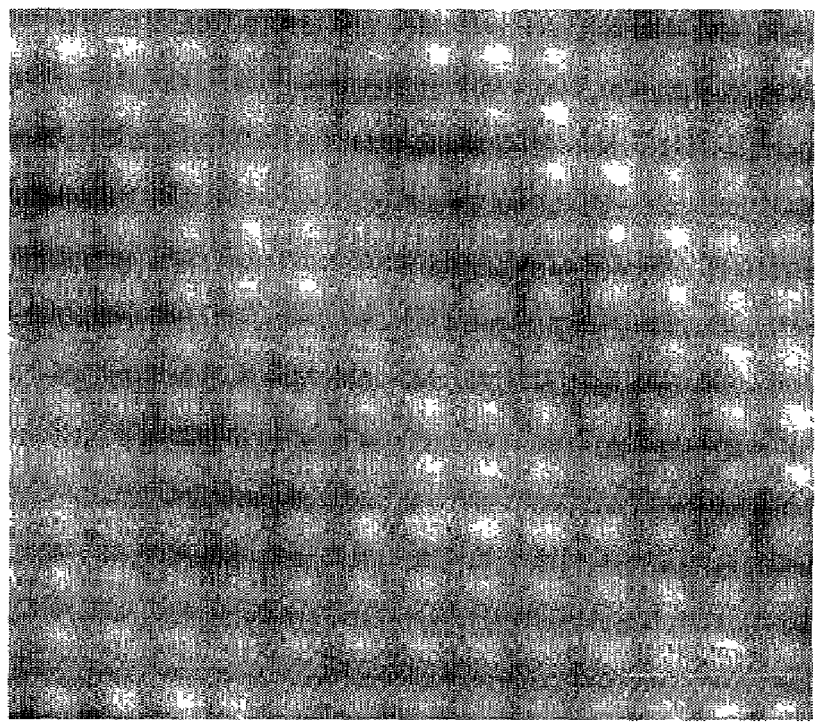
FIG. 4c is an optical micrograph of a subwavelength surface structure.

FIG. 4a is a profile scan of a smooth subwavelength structure. FIG. 4b is a three-dimensional scan of the smooth subwavelength structure. FIG. 4c is a photomicrograph of a subwavelength surface structure. The regularity of the approximately 1 μm period sinusoidal peaks is evident. All structures have been fabricated in semiconductor materials. The process is material independent—ceramics, plastics, glasses, semiconductors and metals are well suited to surface structures.

Figure 5:
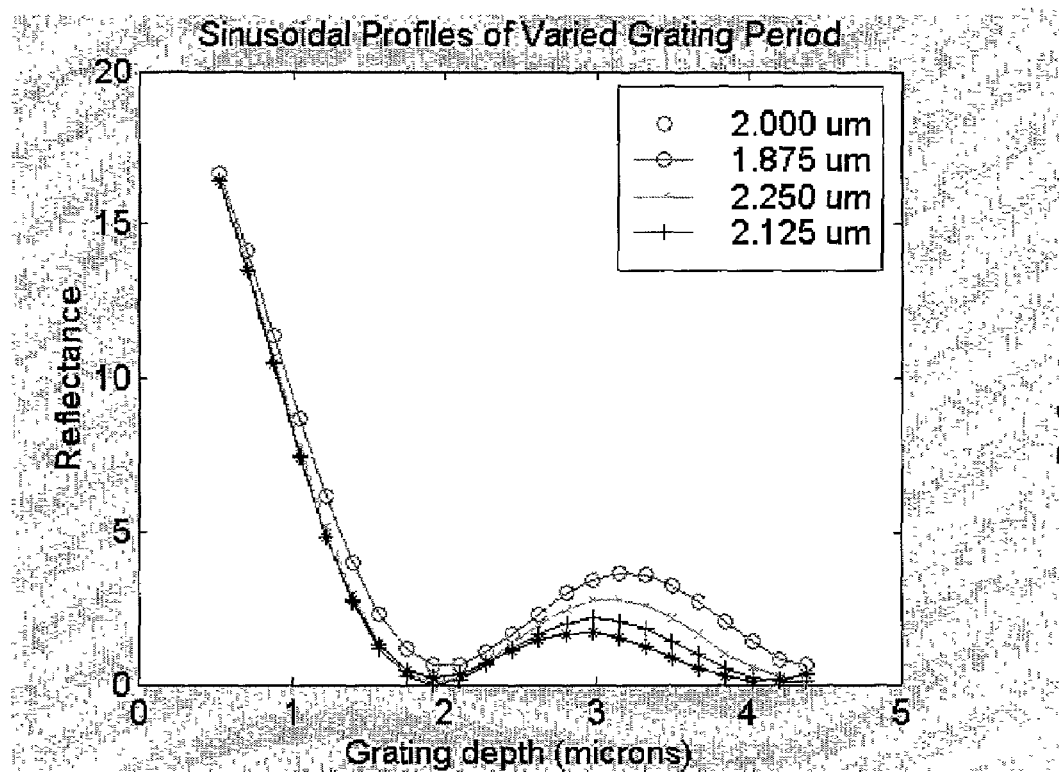
FIG. 5 shows the reflectance prediction of a sinusoidal surface structure in CdTe.

FIG. 5 shows the reflectance calculation of a sinusoidal surface structure in CdTe for an 8 micron TM polarized illuminating wave at zero degrees incidence (scale 0 to 100). The profiles for gratings having periods of from about 1.875 μm to about 2.250 μm all show the ability to have substantially less than about 10% reflectance. i.e., greater than about 90% transmittance, as the grating depth exceeds 1 μm. This performance superscedes that of coatings of the conventional art.

Figure 6:
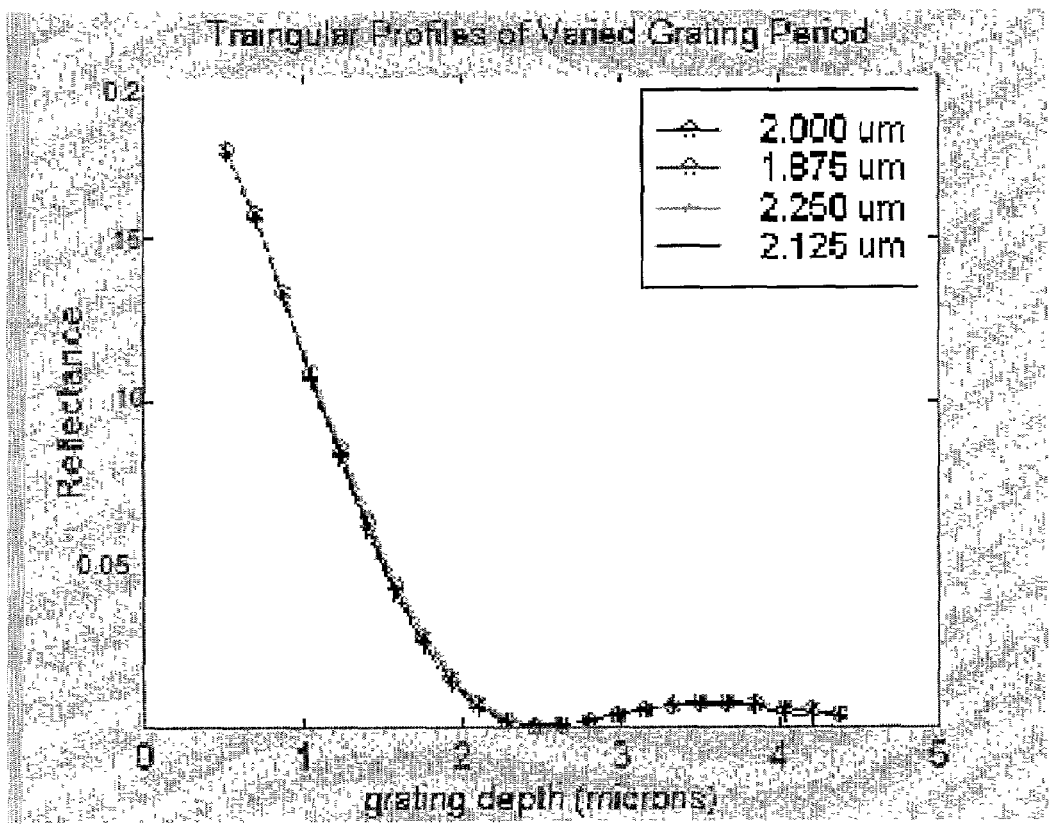
FIG. 6 shows the reflectance prediction of triangular surface structures in CdTe.

FIG. 6 shows the reflectance prediction of triangular surface structures in CdTe to reveal the appropriate surface for an 8 micron TM polarized illuminating wave at zero degrees incidence. Similar to FIG. 5, the profiles for gratings having periods of from about 1.875 μm to about 2.250 μm all show the ability to have substantially less than about 10% reflectance. i.e., greater than about 90% transmittance, as the grating depth exceeds 1 μm.

Figure 7:
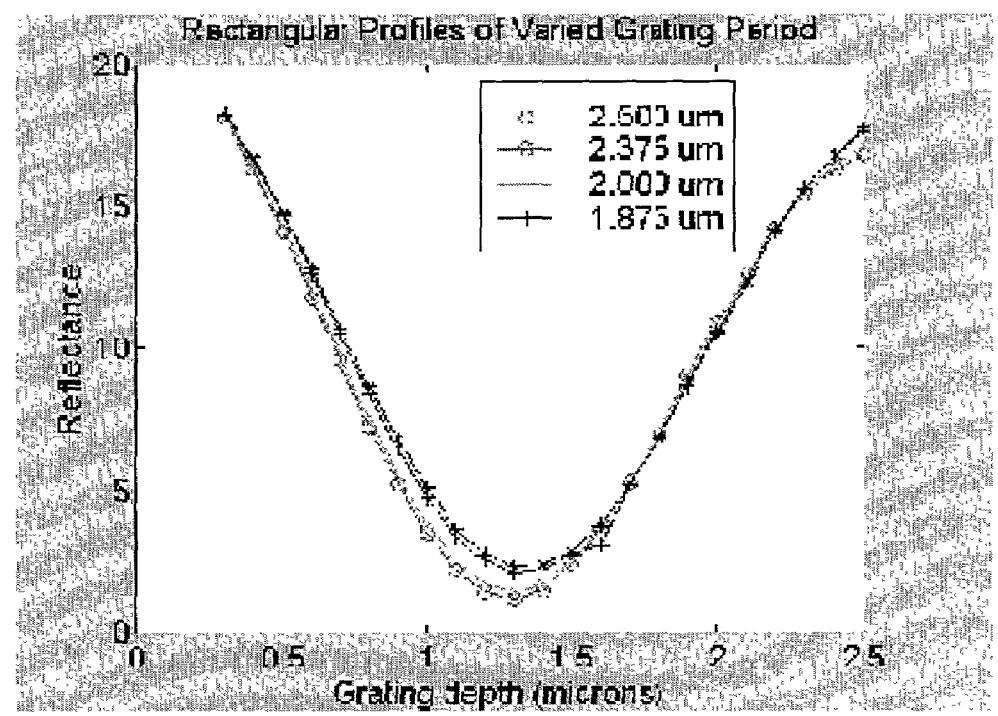
FIG. 7 is a graph of performance predictions for a binary structure.

FIG. 7 is a graph of performance calculations for the prior art binary structure that the invention replaces. A two-dimensional Rigorous Coupled Wave Analysis predicted the reflectance (scale 0 to 100) of binary structure in CdTe. 8 micron TM polarized illuminating wave at zero degrees and of incidence was modeled. In this conventional art technology, a reflectance of less than 10% can only be attained within a narrow range of grating depth.

Figure 8:
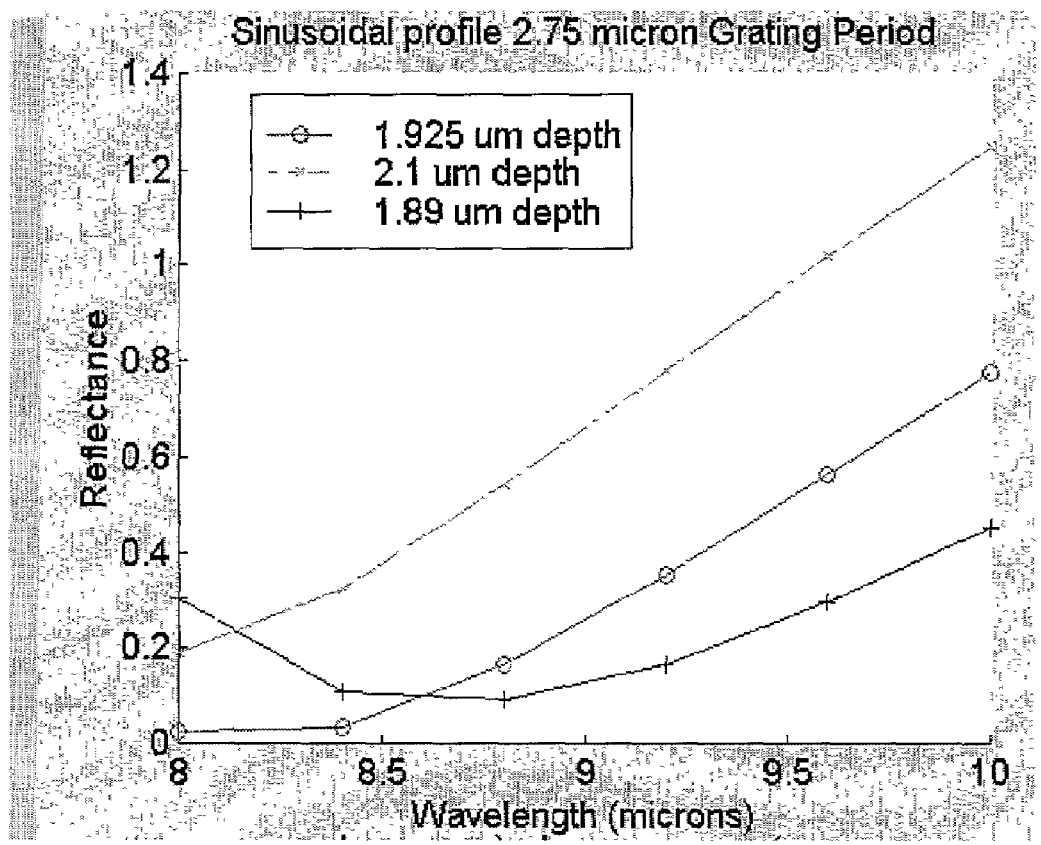
FIG. 8 is a reflectance prediction of a sinusoidal surface structure in CdTe.

FIG. 8 is a reflectance calculation of a sinusoidal surface structure in CdTe for TM polarized illuminating at zero degrees incidence (reflectance scale 0 to 100). The surface has a 2.75 μm pitch sinusoid structure. The reflectance is predicted over a waveband from 8 to 10 μm.

Modeling was performed both to determine the manufacturing parameters as well as to confirm the performance of the structures that were manufactured. Rigorous Coupled Wave (RCW) analysis was used to provide a full vector solution to Maxwell's equations. RCW analysis is a vector model that solves Maxwell's differential equations to predict reflectance and transmission of periodic structures in stratified materials. In practice, the surface structures are segmented into a number of layers of finite size to closely approximate the continuous nature of the surface profile. For diffraction gratings having a pitch greater than the wavelength λ, many diffracted orders must be calculated to ensure conservation of energy. For sub-wavelength structures, 2 to 5 diffraction orders are usually sufficient to account for all of the propagating radiation. This analysis gives all of the electromagnetic field information from the sub-wavelength structure in both the TE and TM modes including the transmitted and reflected light amplitudes and phases. Design parameters such as feature size, duty cycle, etch depth, and illumination angle, wavelength, or polarization are varied to predict the optical reflectance and performance of candidate surface structures.

Two modeling programs were used: one developed by SY Technology, Inc. that models two-dimensional structures (structure pitch in one dimension and depth) and a three dimensional commercially available program called GSOLVER14. GSOLVER calculates diffracted fields and diffraction efficiencies from plane wave illumination of arbitrarily complex grating structures. The illumination may be from any incidence with any polarization (TE, TM, circular, or elliptical). In GSOLVER, the grating structure is defined by a piecewise constant approximation which permits analysis of simple classical grating profiles (blaze, sinusoid, holographic, binary) or complicated structures. GSOLVER can be downloaded from the Internet at www.g-solver.com.

For both programs, arbitrarily complex grating structures can be constructed with approximations to the shape through more than 20 layers. The candidate shapes considered during the modeling effort included a two-dimensional array of sharp cones and sinusoids. Both tools were used to model one and two dimensional periodic structures. The results were identical. From that point on we based our designs on results from the GSOLVER tool.

It is important to note that the modeling efforts must lead to manufacturable designs for the desired structured surfaces. The pitfall of design tools is that the designer can easily optimize for performance at the expense of manufacturing practicality. During modeling, the design must be limited to those feature sizes and aspect ratios that can actually be fabricated.

The candidate designs for anti-reflective surfaces and anti-reflective microlenses begin with material selection. In this example, three materials were selected: Si, ZnSe and CdTe. The CdTe designs are the most preferred in this example. The waveband is used to determine the size and depth of the AR structure. A 10 μm center wavelength was chosen and the AR structure was optimized to minimize reflectance over the 8–14 μm band. Structure shape, pitch and depth were varied to obtain a minimum reflectance.

Binary, sinusoidal and triangular surface structure profiles were considered during the modeling and experimental efforts.

A configuration that may utilize a binary structure was considered during modeling. However, the modeling revealed that binary structures must be etched to a precise depth to achieve a minimum reflectance. In contrast, the triangular and sinusoidal structures of the invention can be etched with greater tolerances. A preferred geometry was found to include a 2 μm pitch, an etch depth of 2 μm, and an aspect ratio of 1. Table 1 summarizes the experimental parameters of the AR structure.

TABLE 1

Experimental Layout Table
Anti-Reflective Structures

| Feature Size | Etch Depth |
| --- | --- |
| 2.0 μm | >2.0 μm |

The microlens was designed for embedding in the first surface of a CdTe substrate. The microlens diameter was set to 60 μm and a square packing structure was selected to achieve a maximum fill factor. The lens radius of curvature will be the result of an etch that is designed to accommodate the AR structure. The target curvature is 92.5 microns with a spherical profile. The goal is to achieve diffraction limited performance and a 40 μm spot size at the focal length. The microlens specifications are summarized in Table 2. Arrays of 128×128 lenses are fabricated in the experiments.

TABLE 2

Design Parameters.

| Parameter | Nominal Value |
| --- | --- |
| Wavelength | MWIR and LWIR* |
| Grating Pitch | 2 μm for CdTe |
| Grating Depth | 2 μm for CdTe |
| Grating Profile | Sinusoidal or Triangular |
| Lens Shape | Hemispherical |
| Lens Diameter | 60 μm |
| Lens Performance | Diffraction Limited |
| Lens Etch Depth | 5 μm (as designed) |
| Spot Size | 40 μm |

*manufacturing processes dictate that the current structures will operate well in the LWIR (long wavelength infrared) as well as in the MWIR (medium wavelength infrared).

The need for ARS (antireflective surface) at the micron geometry in CdZnTe requires the creation of complex patterns at the surface of semiconductor wafers. The photolithography used to create these complex patterns is a three-step process. First the pattern of interest is formed in a "mask"—an optically opaque film of, for example, iron oxide on a glass substrate. Second, a layer of organic photoresist is deposited onto the surface of a semiconductor wafer and exposed to uv radiation through the mask, thereby forming a latent image of the mask in the resist. The resist is then developed to remove areas not exposed, leaving some areas of the wafer covered with resist and others bare. Thirdly, the wafer+resist is placed in a chemical etchant which dissolves bare areas of the wafer more rapidly than it dissolves the resist. Such an etchant is characterized by its selectivity—the ratio of dissolution rates. Thus a pattern transfers from the mask into the wafer surface.

The usual application of photolithography to such devices as computer chips, lasers, and HgCdTe FPAs, results in "binary" changes in height on a surface; i.e., to features such as mesas and recesses. For this, a simple binary mask and a liquid chemical etchant are appropriate. Complex features such as the ARS and micro lenses of the preferred embodiments require gradual changes in feature height. To achieve this, several variants must be made to the conventional photolithographic process. First, an "analog" or gray-scale mask consisting of areas whose transparency can be any value between the two extremes of a binary mask is required. Secondly, to achieve high selectivity and a more anisotropic removal, a vapor-phase etchant containing a plasma of such gases as $H_2$, $O_2$, $SF_6$, etc. is used. Gray-scale masks and plasma etchants were used to achieve the results reported here.

The performance of the samples was measured on several different instruments. The instruments were utilized on an as-available basis so not all samples were measured with all instruments. The instruments were a monostatic BRDF instrument located at SY Technology, Inc., an FTIR (Fourier Transform Infrared) spectrometer at the Air Force Research Lab at Eglin AFB, and an FTIR spectrometer at the University of Alabama in Huntsville.

The BRDF is the "Bidirectional Reflectance Distribution Function." It gives the reflectance of a target as a function of illumination geometry and viewing geometry. The BRDF depends on wavelength and is determined by the structural and optical properties of the surface, such as shadow-casting, multiple scattering, mutual shadowing, transmission, reflection, absorption and emission by surface elements, facet orientation distribution and facet density.

A monostatic BRDF (Bidirectional Reflectance Distribution Function) instrument located at SY Technology, Inc. was used to measure reflectance of etched structures at the 10.6 μm $CO_2$ laser line. Radiation arrived at normal incidence and a beamsplitter and a HgCdTe detector collected reflected light.

In all the BRDF measurements, the reflectance of the structured surface was ratioed to the light incident on a non-structured (but optically smooth) neighboring region. For the spectrometers, the throughput of the samples were measured relative to unetched portions of the sample. A single beam spectrum through the etched sample was ratioed by a single beam spectrum through an unetched portion of the sample. The ratio removes instrumental response and the effect of the back surface of the sample. A throughput of unity indicates that the etched and unetched areas have identical transmission while a throughput greater than one indicates improved anti-reflective performance of the etched structure. Other measurements measured the transmission through the part in both etched and unetched portions of the sample relative to air, providing a direct comparison of the transmission improvement.

Figure 9:
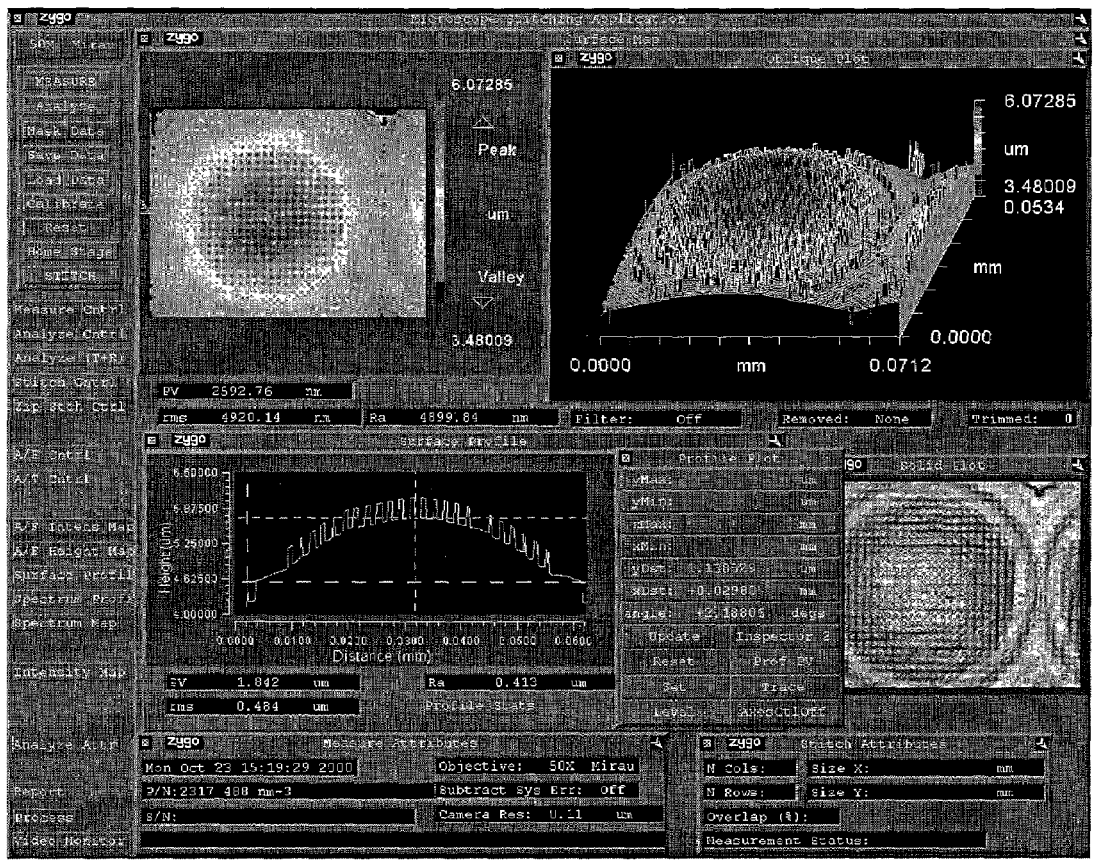
FIG. 9 shows a proof of concept profile in photoresist.

FIG. 9 shows a proof-of-concept profile in photoresist. The goal was to combine the microlens and anti-reflective property in a single element. This research is to determine if that component can be made in a single lithography step. It was determined that the best approach was to combine the microlens and anti-reflective structure at the lithographic mask and then expose the desired structure in photoresist. Once the structure shape exists in photoresist, selective etching stretches the profile to the required shape. The photoresist profile shown in FIG. 9 is the result of this single lithography process. The mask used a gray scale profile to achieve both the fine AR structure and the microlens profile. The photoresist depth for the AR structure is 0.4 μm and the lens peak to valley is 2.0 μm. The profile is more binary than was desired. Before and after the etch step this lens was be viewed with an atomic force microscope and scanning electron microscope to yield the exact shape. From that data the process (mask, exposure, development) was altered to achieve the required profile.

This technology represents a IRFPA improvement that has substantial commercial potential. The small structures overlaid onto curved surfaces is a general technology that has heretofore been limited to holographic techniques.

During the FPA design, emphasis was placed on minimizing reflectance in the about 8–14 µm spectral region. Structure shape, pitch and depth were varied to minimize reflectance. Binary, sinusoidal, and triangular surface profiles were modeled. Binary structures were found to be less preferred because modeling revealed that the precision in depth required for low reflectance was not easily achievable with current plasma manufacturing techniques. Modeled manufacturing tolerances for sinusoidal and triangular profiles were reasonable, with sinusoidal structures having the greater tolerance. Therefore, sinusoidal structures were the preferred structure. The pitch of the sinusoidal structures was also deemed to be important. Two µm structures were predicted to show the best performance with loss of performance with wider pitched samples.

Figure 10:
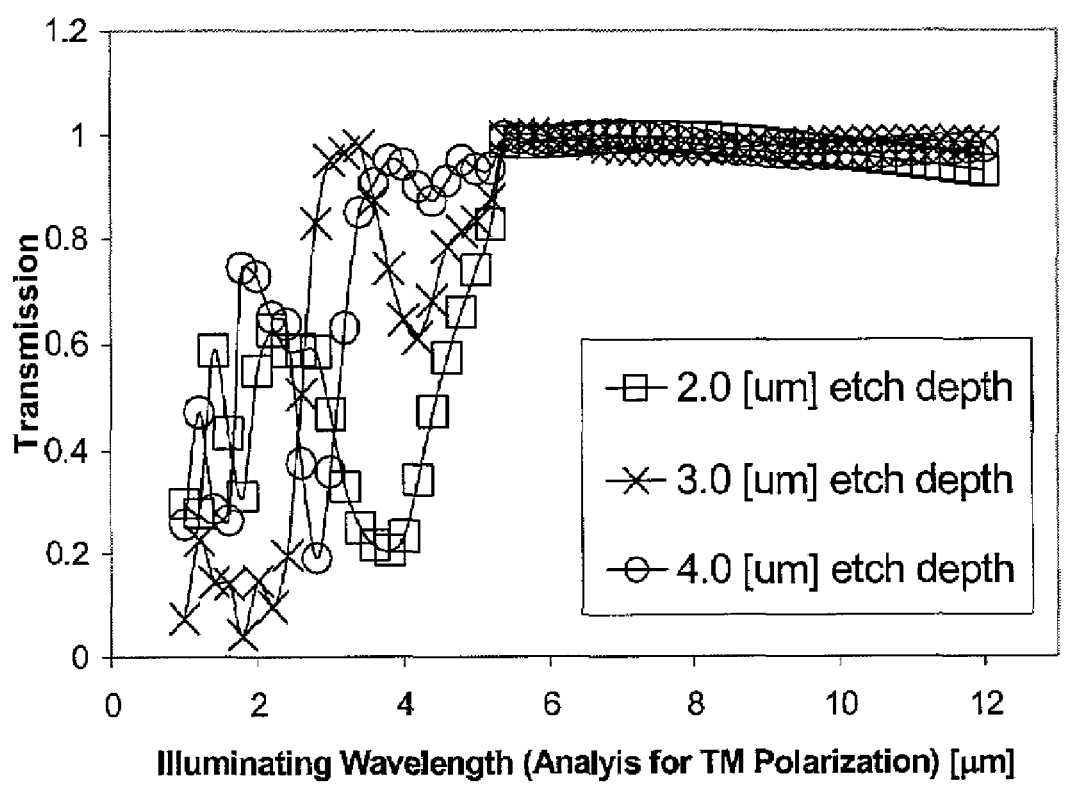
FIG. 10 is the theoretical spectral transmission of 2 µm sinusoidal structures with various depths.

Modeling results for 2 µm sinusoidal structures, a preferred case, are shown in FIG. 10.

FIG. 10 is the theoretical spectral transmission of 2 µm sinusoidal structures with various depths. The functional form of transmission versus etch depth has a broad maximum. As long as the etch depth, and therefore the structure height, is beyond the design point, the reflectance is minimized. A structure with 2 µm pitch was judged to be within fabrication capabilities. The target value for etch depth was 2 µm or greater as determined by modeling, as in FIG. 10.

Figure 11:
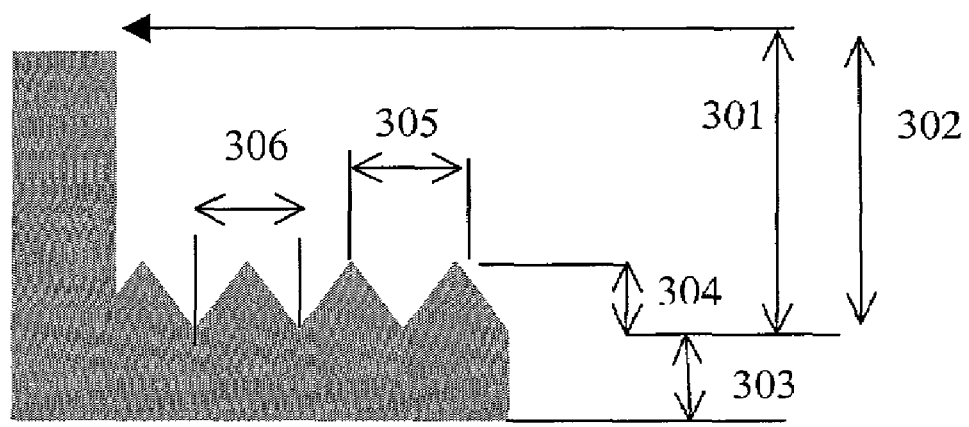
FIG. 11 shows a schematic drawing of a pattern formed in a photoresist layer after exposure and development.

Photolithographic techniques were used to fabricate sinusoidal structures in wafer surfaces. Gray scale processes allow ideal surface structures to be created. One technology to use is a gray tonal mask. An example of such a technique is disclosed in U.S. Pat. No. 5,482,800 to Gal et al. Using this type of mask results in improved efficiency and may be used to create aspheric, anamorphic, pyramidal, and hybrid surface shapes such as anti-reflective structures overlaid on microlenses. Structures with a pitch as low as 2 µm can be obtained. In accordance with the teachings of the present application, gray scale masks were designed and used to expose conventional resists. A schematic drawing of a pattern formed in a photoresist layer after exposure and development is shown in FIG. 11. The typical offset for the sample in this study is about 1.2–1.3 µm and the pattern height is about 0.3 µm. This offset is inserted to prohibit the white light Zygo Interferometer from "seeing" the photoresist/substrate interface during pre-etch metrology.

FIG. 11 is a drawing of a cone pattern produced in a resist layer after UV exposure through a gray scale mask and development. This cone pattern is used to create sinusoidal structures in the CdZnTe surfaces. In FIG. 11, 301 is bias, 302 is peak to valley distance, 303 is offset, 304 is pattern height, 305 is pitch and 306 is feature size.

The photoresist pattern is then transferred into the sample of interest. In conventional photolithography, where only binary patterns need be transferred, the technique of wet chemical etching is used. This technique is isotropic and therefore not applicable to the transfer of patterns with "analog" shapes such as those required for ARS. Plasma techniques such as Reactive Ion Etching (RIE) and Electron Cyclotron Resonance (ECR) etching are known to be highly anisotropic and are commonly used to etch robust semiconductors such as Si and GaAs. RIE produces structural and electrical damage in softer materials such as CdZnTe. Therefore, in order to make ARS with high aspect ratios without severely damaging the material, the ECR technique was chosen. This ECR technique is described by J. D. Benson, et al., Control of the Aspect Ratio in Dry Etched II–VI Compounds, IRIS Materials Conference, Boulder, CO, Aug. 11–13, 1998. For a description of the RIE etching, see also E. R. Schulte et al., Development of Dry (ECR/RIE) Etching for the Processing of HgCdTe into IR Detector Arrays, PROC 1993 IRIS Infrared Materials Specialty Group, 1993.

Using the gray scale lithography mentioned above, features about 0.3 µm high in the resist yield features with heights of about 2–4 µm in the CdZnTE, implying that the etch selectivity has a value between 6.7 and 13.3. When the conventional NVESD ECR (Night Vision Electronic Sensors Directorate Electron Cyclotron Resonance) process is used in conjunction with AZ 1529 resist, etch rates of 0.1 µm/min and 0.5 µm/min are obtained for resist and $Cd_{0.97}Zn_{0.03}Te$ (211)A respectively, giving a selectivity of only 5:1.

Another problem is the offset 303 defined in FIG. 11. The ECR process must be able to etch through this offset 303 while maintaining the pattern above it. This offset is about 1.2 µm for the CdTe/Si samples and about 1.3 µm for the CdZnTe samples.

A Model 357 PlasmaQuest ECR reactor with an ASTeX 2.45 GHz microwave source supplying its power through a quartz window was used in these experiments. An upper electromagnet produced an 873 G field to create the resonance condition. A capacitively coupled 40.68 Mhz RF (radio frequency) generator was used to supply a DC bias potential using between 0 to 300 W of input power. A 4:1 Argon to hydrogen ratio, with the hydrogen being injected downstream to give a 2 mTorr process pressure. The resulting plasma process provides primarily $Ar^+$ ions and atomic hydrogen gas etchants. For these experiments the self-bias was varied between 0 and −635 V or 0 to 300 W of input power. The higher self-bias allows a greater amount of $Ar^+$ bombardment. This achieves a more effective removal of ZnTe complex in the CdZnTe in a manner as described by Keller et al., J. Electronic Mater., 25(6), 534 (1997).

Both CdTe and CdZnTe were used. (100) and (111)B CdZnTe wafers from II–VI Inc., (211)A CdZnTe wafers from Nimtec, (211)B CdTe epilayers grown on 3 inch diameter Si wafers in the NVESD microfactory using the process outlined by Dhar et al., J. Electronic Mater., 29(6), 748 (2000). Also, (111)CdZnTe wafers provided by Raytheon Semiconductor were used. A gray scale mask consisting of one-dimensional sinusoids, two-dimensional cones, and one-dimensional sawtooth patterns, each with pitches of 4.0, 3.0, 2.0, and 1.0 µm, was utilized to allow simultaneous etching of a variety of patterns. The patterns of interest for this research are the 4.0, 3.0, 2.0, and 1.0 µm period two-dimensional cones. Cone shaped features are made in the resist because these lead to sinusoid shapes in the CdZnTe as the plasma process slightly rounds the shapes.

As mentioned previously a photoresist-to-CdZnTe ECR etching selectivity higher than the conventional value of 5:1 is preferred. An extensive development program was carried out to achieve higher values. In order to attain the preferred higher selectivity, the effect of varying the DC bias of the plasma was explored. DC bias is the negative potential that is applied to a sample during plasma processing. This effects the impact energy of ions arriving at the sample surface.

The DC bias power affects the differential in selectivity between the photoresist and the CdZnTe. The effect of DC bias on the etch rates of photoresist, AZ 1529, and (100)

Figure 12:
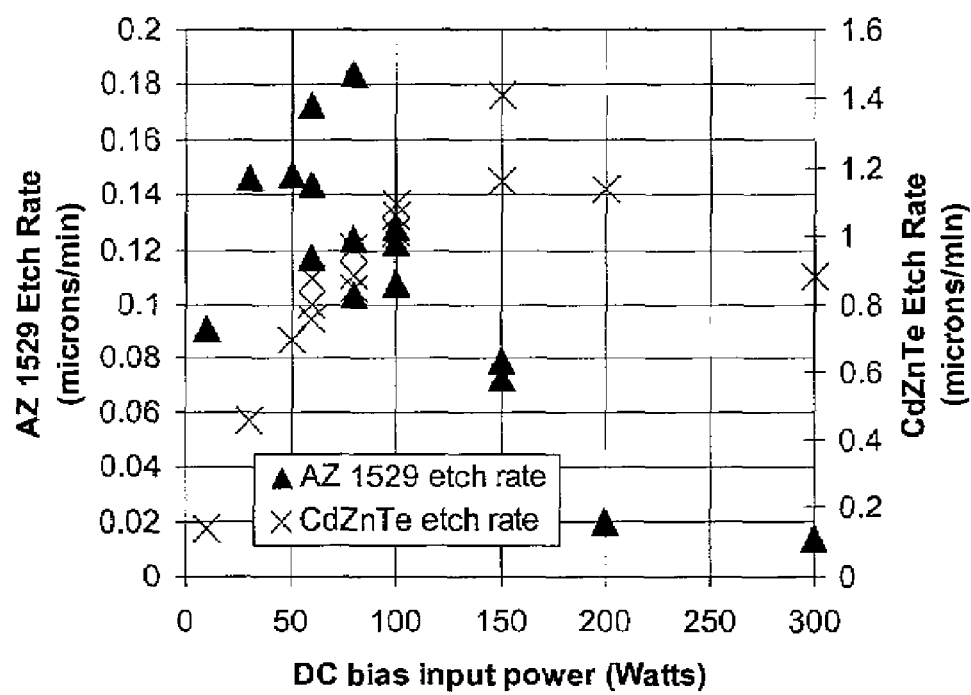
FIG. 12 shows the etch rates of (100)CdZnTe and AZ 1529 photoresist vs. DC bias input power.

$Cd_{0.97}Zn_{0.03}Te$ are shown in FIG. 12. FIG. 12 shows the etch rates of (100) CdZnTe and AZ 1529 photoresist vs. DC bias input power. The (100) surface of $Cd_{0.97}Zn_{0.03}Te$ etches faster than the (211)A surface. FIG. 12 shows the "crossover" in the photoresist and substrate etch rates at about 100 Watts. As a result, the CD bias power can be used to control the selectivity.

Figure 13:
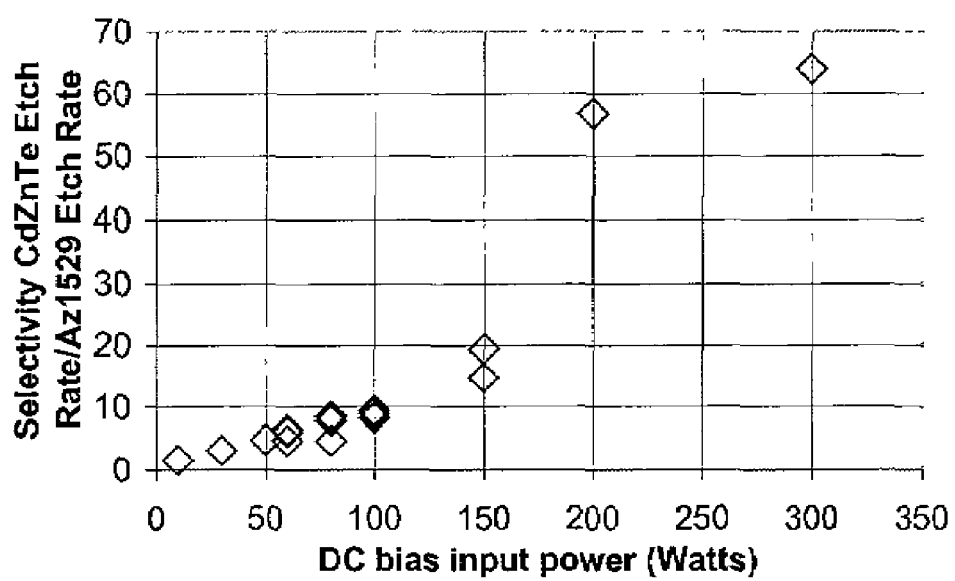
FIG. 13 shows the selectivity between (100)CdZnTe to AZ 1529 photoresist vs. DC bias input power.

FIG. 13 shows the selectivity between (100) CdZnTe to AZ 1529 photoresist vs. DC bias input power. In FIG. 13, the boost in selectivity between about 150 and about 200 DC Watts is quite notable. The DC bias power can therefore be varied to effect an overall change in the selectivity of CdZnTe to AZ 1529, as is shown in FIG. 13.

The invention is not restricted to AZ 1529 photoresist, and any appropriate positive or negative photoresist can be used. After etching, the photoresist can be removed by conventional methods using solvents or by ashing.

Etch rates of the various orientations were measured under the following process conditions: 4:1 ratio of Argon:Hydrogen, 300 W microwave power, 2 mTorr process pressure, 60W DC bias input power, 16 minutes. These values are shown in Table 3.

TABLE 3

Bulk etch depths and rates for CdZnTe (100), CdZnTe (211)A, CdZnTe (111), and CdTe (211)B.

|  | CdZnTe (100) | CdZnTe (211)A | CdZnTe (111) | CdTe (211)B |
|---|---|---|---|---|
| Thickness (μm) | 9.3 | 8.0 | 7.2 | 7.6 |
| Etch Rate (μm/minute) | 0.58 | 0.50 | 0.45 | 0.48 |

Figure 14:
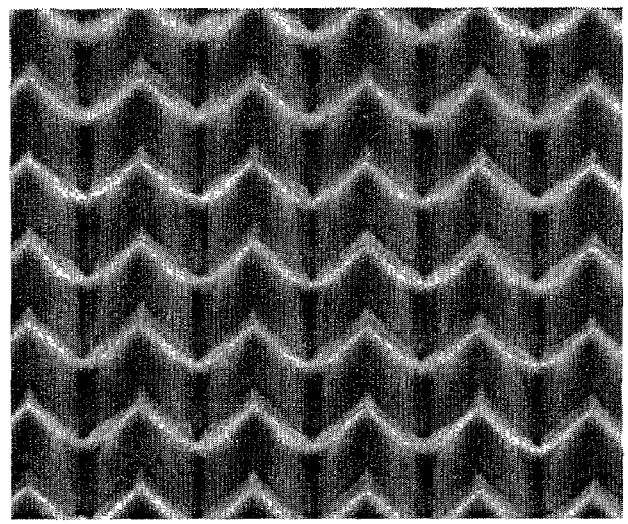
FIG. 14 is a scanning Electron Micrograph of 4 μm pitch sinusoids ~2.5–3.0 microns deep etched into (211)CdTe/(211)Si.

A preferred process for use on CdTe surfaces is as follows: 4:1 ratio of Argon:Hydrogen, 300 W microwave power, 2 mTorr process pressure, 100W DC bias input power, 15 min. A scanning electron micrograph of a wafer processed under these conditions is shown in FIG. 14. FIG. 14 is a scanning Electron Micrograph of 4 μm pitch sinusoids ~2.5–3.0 μm deep etched into (211)CdTe/(211)Si. The height of the two dimensional structure is approximately 2.5–3.0 μm. Since the H-value of the pattern in the photoresist was 0.3 μm, selectivity for this process must have been 8.3–10.0 etch selectivity, a value consistent with the etch selectivity shown in FIG. 13. The average AZ 1529 photoresist etch rate is 0.12 μm/minute. This is consistent with the need of a 15 minute etch.

Figure 15:
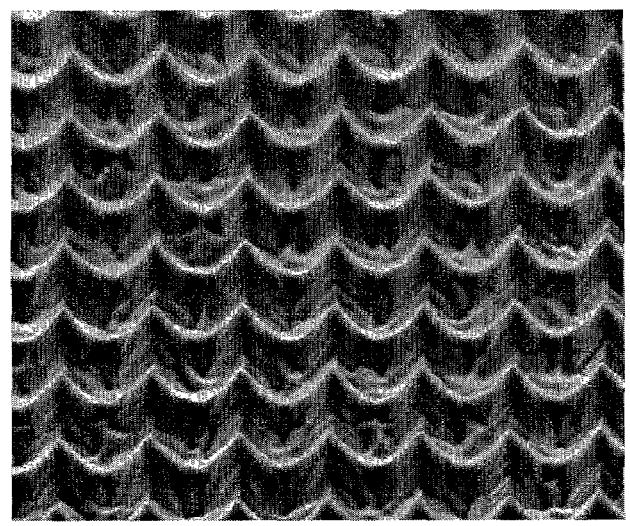
FIG. 15 is a scanning Electron Micrograph of 4 μm pitch structures 2.5–3.0 microns deep etched into (111)CdZnTe.

FIG. 15 is a scanning Electron Micrograph of 4 μm pitch structures ~2.5–3.0 μm deep etched into (111)CdZnTe. As shown in FIG. 15, a single plasma etch yielded undesirable roughening and non-sinusoidal shapes in the CdZnTe. The (111)CdZnTe sample, that was etched simultaneously with the (211)B CdTe of FIG. 14, was roughened and in a shape far different from the initial cone patterns in the photoresist. Even though the depths and photoresist removal is similar, the roughening and shape of the CdZnTe needs modification. To transfer patterns into CdZnTe with higher fidelity, it was necessary to use a two-step plasma etch process. The parameters for this process are: step one, standard process conditions with 100W of DC bias input power for 8 minutes; step two, standard process conditions with 150W of DC bias input power for 4.5 min. The first step with and DC bias input power of 100W is used to remove the photoresist offset. The second takes advantage of the increased selectivity at higher DC bias and leads to a hardening of the resist and the sharpening of features in CdZnTe.

Figure 16A:
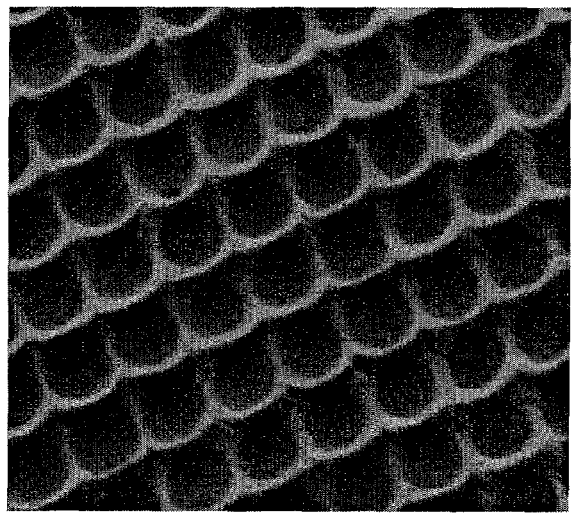
FIG. 16 is a scanning Electron Micrograph of 16a) 2 μm 16b) 3 μm and 16c) 4 μm pitch sinusoids about 4.0 μm deep etched into (111)CdZnTe.
Figure 16B:
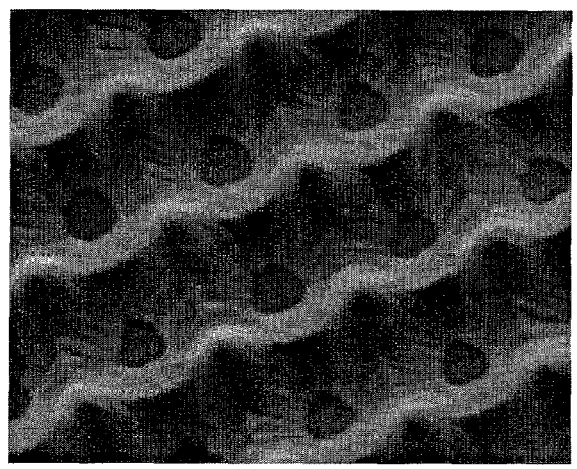
Figure 16C:
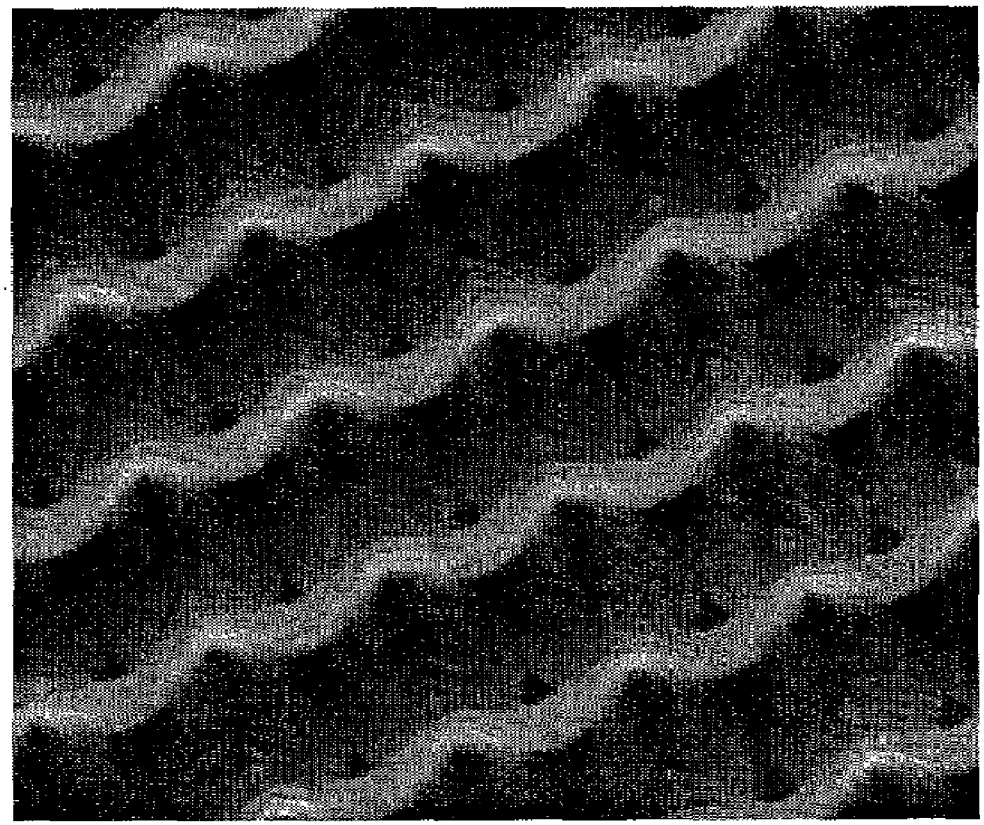

An example of a pattern etched into CdZnTe is shown in FIG. 16. FIG. 16 is a scanning Electron Micrograph of 16a) 2 μm 16b) 3 μm and 16c) 4 μm pitch sinusoids about 4.0 μm deep etched into (111) CdZnTe. The smoothing is consistent with Keller et al., J. Electronic Mater., 25(6), 534 (1997), and suggests that the Zn is being effectively ion-milled by the $Ar^+$ ion being accelerated by 150W input power. A 13.3 selectivity is observed between the 4 μm deep structures and the 0.3 μm structures in the original photoresist. In contrast, FIG. 13 shows an average selectivity of 17, but this is a two-step process and the additional hardening of the photoresist during the second step increases the selectivity disproportionally.

One inconsistency does exist in the example shown in FIG. 16: the overall removal rates. A photoresist removal rate of about 0.12 μm/min for about 8 minutes leads to the removal of about 0.96 μm, and about 0.076 μm/min for about 4.5 minutes would lead to about 0.34 μm removed. The about 1.3 μm offset plus an about 0.3 μm pattern height in the photoresist is about 1.6 μm. The inconsistency suggests only about 1.3 μm of photoresist was removed. Normally an increase in DC bias increases the etch rate of the material, however a "hardening effect" occurs in the photoresist, as is suggested in FIG. 13. This hardening probably does not happen instantaneously. Therefore for a short time an enhanced etching of the photoresist occurs. This effect would not affect the etching of the CdZnTe since it has behavior more excepted with ion-milling that occurs with high DC biasing.

The optical characteristics of these structures are superior. Results of monostatic reflection measurements performed at 10.6 μm wavelength are shown in Table 4.

TABLE 4

Reflectivity measurements performed at 10.6 μm wavelength for CdZnTe (111).

| Period | CdZnTe (111), 4.0 μm tall Reflectance % |
|---|---|
| 2 μm | 0.7 |
| 3 μm | 4.4 |
| 4 μm | 17.9 |

Table 4 gives results for structures shown in FIG. 16 and are in agreement with the theoretical spectra. Modeling indicated that 2 μm pitch structures would give the best results with diminishing performance with wider structures. A reflectance of 0.7% is highly useful for an IRFPA (infrared focal plane array) application, and this represents a major enhancement of the 80% transmission on an optically flat surface. The preferred embodiments can extend the reflectance results to include the entire 8–14 μm spectral region and examining transmission at different incidence angles.

The possibility of creating textures in CdZnTe surfaces which might give rise to enhanced optical transmission characteristics has been demonstrated. Candidate structures with various shapes and sizes were modeled to assess their optical transmission. Gray scale masks were fabricated and used to UV irradiate conventional photoresist layers on CdZnTe wafers. Patterns were transferred from resist to CdZnTe by etching the wafer surface in an ECR plasma. Sinusoids with 2 μm pitch and 4 μm height gave transmission values in CdZnTe of 99.3% for 10.6 μm incident radiation. Such structures have immediate use as antireflective elements on the back surface of HgCdTe infrared focal plane arrays.

It will be apparent to those skilled in the art that various modifications and variations can be made in the anti-reflective structure and related optical elements of the present invention without departing from the scope or spirit of the invention.

Figure 18:
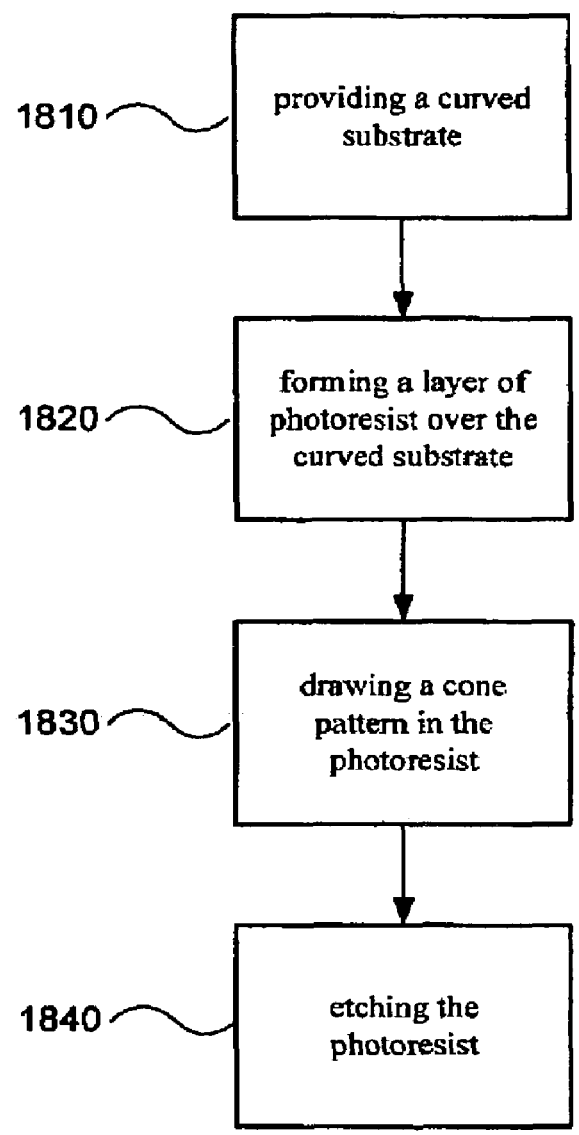
FIG. 18 is a flowchart illustrating a method according to at least one embodiment of the invention.
Figure 19:
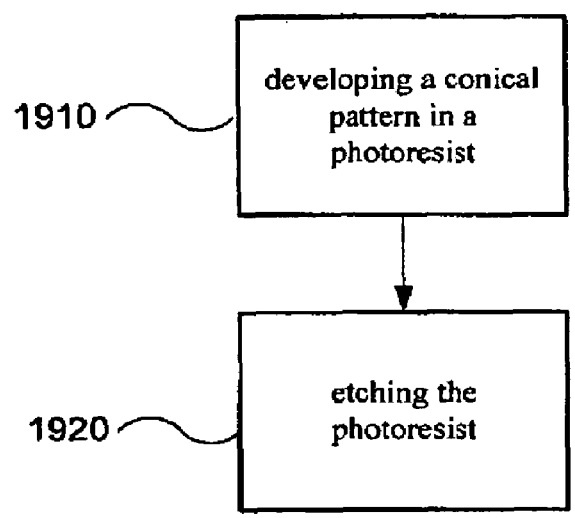
FIG. 19 is a flowchart illustrating a method according to at least one embodiment of the invention.
Figure 20:
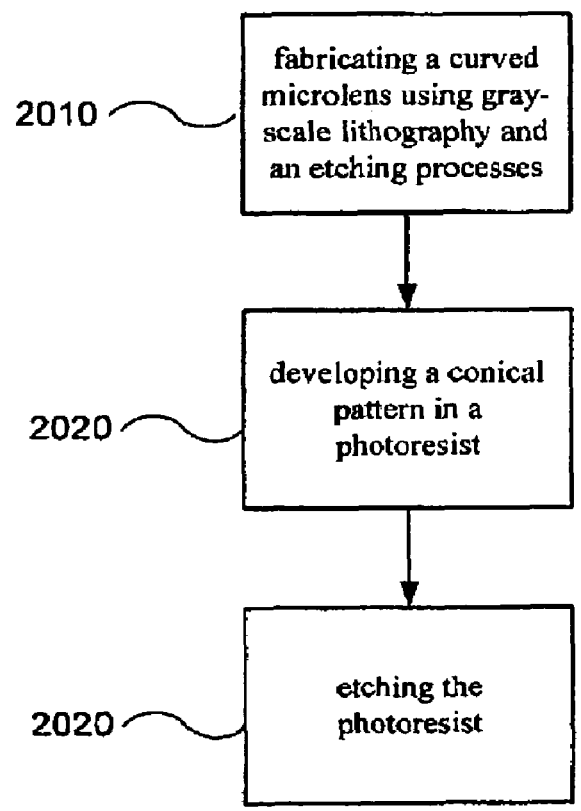
FIG. 20 is a flowchart illustrating a method according to at least one embodiment of the invention.

In view of the foregoing disclosure, those skilled in the art will appreciate that embodiments of the invention include methods for performing the various actions, sequences, steps and/or algorithms described herein. For example, referring to FIG. 18, a method can include providing a curved substrate, 1810. A layer of photoresist can be formed over the curved substrate, 1820. A cone pattern can be drawn in the photoresist, 1830 and the photoresist can be etched, 1840. Further, as illustrated in FIG. 19, another method can include developing a conical patter in a photoresist, 1910 and etching the photoresist, 1920. Still further, as illustrated in FIG. 20, another method can include fabricating a curved microlens using grayscale lithography and an etching process, 2010. A conical pattern can be developed in the photoresist, 2020 and the photoresist can be etched, 2030.

The previously described flowcharts illustrate aspects of methods according to embodiments of the invention. However, these illustrations should not be construed to limit embodiments of the invention to the illustrated sequences or orders. Additionally, these illustrations are not exhaustive of the embodiments. Accordingly, embodiments of the invention can include any of the actions, sequences, steps and/or algorithms described herein.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method to manufacture an anti-reflective structure, which comprises:
    providing a curved substrate;
    forming a layer of photoresist over the curved substrate;
    drawing a cone pattern in the photoresist; and
    etching the photoresist, wherein the structure has a plurality of
    protrusions having a feature size that is smaller than a wavelength of incident light and the protrusions are smoothly increasing In height in either a sloped linear manner or a curvilinear manner, wherein the curved substrate comprises a microlens fabricated using gray-scale lithography and an etching processes, and wherein the conical pattern has a pitch of approximately 2 μm and wherein the microlens is designed to operate in the long wavelength infrared (LWIR) and medium wavelength infrared (MWIR) frequencies.

2. The method of claim 1, wherein drawing the cone pattern in the resist is performed using a gray scale mask.

3. The method of claim 1, wherein the etching the photoresist is performed using reactive ion etching or electron cyclotron etching.

4. The method of claim 1, wherein the protrusions have a sinusoidal cross-section or a triangular cross section.

5. The method of claim 1, wherein the structure comprises at least one material selected from the group consisting of CdTe, CdZnTe, $Cd_{0.97}Zn_{0.00}Te$, Si, ZnSe and CdTe/Si.

6. The method of claim 1, wherein the etching the photoresist is a two-step etching process.

7. The method of claim 6, wherein the two-step etching process comprises a first etch having a lower DC bias input power and a second etch having a higher DC bias input power.

8. The method of claim 1, wherein the etching the photoresist is performed using electron cyclotron resonance.

9. The method of claim 1, wherein the protrusions repeat across a surface of the structure in at least one dimension to transmit the incident light.

10. The method of claim 1, wherein the protrusions periodically repeat across a surface of the structure in two dimension.

11. The method of claim 1, wherein the protrusions do not periodically repeat across a surface of the structure in two dimensions.

12. The method of claim 1, wherein the microlens and conical pattern are applied to the photoresist simultaneously using gray-scale lithography.

13. A method of manufacturing an anti-reflective structure for at least one light wavelength, which comprises:
    developing a conical pattern in a photoresist, where the photoresist has been deposited on a curved substrate; and
    etching the photoresist, wherein the etching forms a conical pattern in the substrate made up of individual conical elements, the conical pattern in the substrate forming the anti-reflective structure in the curved substrate, where the conical elements have features sizes smaller than the wavelength, wherein the curved substrate comprises a microlens fabricated using gray-scale lithography, and wherein the conical pattern has a pitch of approximately 2 μm and wherein the microlens is designed to operate in the long wavelength infrared (LWIR) and medium wavelength infrared (MWIR) frequencies.

14. The method of claim 13, wherein the etching of the photoresist is substantially complete.

15. The method of claim 13, wherein the microlens and conical pattern are applied to the photoresist simultaneously using gray-scale lithography.

16. A method of manufacturing a microlens with an anti-reflective structure comprising:
    fabricating a curved microlens using gray-scale lithography and an etching processes;
    developing a conical pattern in a photoresist, where the photoresist has been deposited on the microlens; and
    etching the photoresist, wherein the etching forms a conical pattern in the microlens made up of individual conical elements, the conical pattern in the microlens forming the anti-reflective structure in the curved substrate, wherein the conical pattern has a pitch of approximately 2 μm and an etch depth of ≧2 μm.

17. The method of claim 16, wherein the microlens has a lens diameter of approximately 60 μm and a lens etch depth of approximately 5 μm.

18. The method of claim 17, wherein the microlens has a hemispherical shape.

19. The method of claim 16, wherein the microlens is designed to operate in the long wavelength infrared (LWIR) and medium wavelength infrared (MWIR) frequencies.

20. The method of claim 19, wherein the microlens has a lens diameter of approximately 60 μm and a lens etch depth of approximately 5 μm.

21. The method of claim 16, wherein the microlens and conical pattern are applled to the photoresist simultaneously using gray-scale lithography.

* * * * *